US006709170B2

(12) United States Patent
Tartaglia et al.

(10) Patent No.: US 6,709,170 B2
(45) Date of Patent: Mar. 23, 2004

(54) PLASTIC ENCAPSULATION OF OPTOELECTRONIC DEVICES FOR OPTICAL COUPLING

(75) Inventors: Michael L. Tartaglia, Thornton, CO (US); Carl Embry, Boulder, CO (US); Mark Stiehl, Lafayette, CO (US); Timothy Bingaman, Thornton, CO (US)

(73) Assignee: Optical Communications Products, Inc., Woodland Hills, CA (US)

(*) Notice: Subject to any disclaimer, the term of this patent is extended or adjusted under 35 U.S.C. 154(b) by 21 days.

(21) Appl. No.: 10/035,356

(22) Filed: Nov. 9, 2001

(65) Prior Publication Data

US 2002/0181899 A1 Dec. 5, 2002

Related U.S. Application Data

(60) Provisional application No. 60/260,633, filed on Jan. 8, 2001.

(51) Int. Cl.[7] .................................................. G02B 6/42
(52) U.S. Cl. ........................ 385/94; 385/88; 385/89
(58) Field of Search ............................. 385/88, 89, 94; 372/50

(56) References Cited

U.S. PATENT DOCUMENTS

| | | | | |
|---|---|---|---|---|
| 4,186,996 A | * | 2/1980 | Bowen et al. ................. 385/92 |
| 4,843,036 A | * | 6/1989 | Schmidt et al. ................ 438/64 |
| 5,557,116 A | * | 9/1996 | Masui et al. .................. 257/100 |
| 5,574,806 A | * | 11/1996 | Kragl et al. .................... 385/14 |
| 5,614,131 A | * | 3/1997 | Mukerji et al. ............... 264/1.9 |
| 5,993,075 A | * | 11/1999 | Huang et al. .................. 385/92 |
| 6,019,523 A | * | 2/2000 | Honmou ........................ 385/94 |
| 6,356,686 B1 | * | 3/2002 | Kuczynski ..................... 385/39 |
| 6,379,988 B1 | * | 4/2002 | Peterson et al. ............... 438/51 |

\* cited by examiner

Primary Examiner—John D. Lee
Assistant Examiner—Daniel Valencia
(74) Attorney, Agent, or Firm—Barlow, Josephs & Holmes, Ltd.

(57) ABSTRACT

A method and apparatus for encapsulating optoelectronic devices provides for accurately positioning and shaping an encapsulant by actively referencing the device die upon which the optoelectronic devices are formed. A molding tool is accurately aligned to the optoelectronic devices in the x, y and θ directions using mechanical guides and is aligned in the z direction by actively referencing the device die. The shaped encapsulant is preferably an angled wedge having a minimum thickness over the optoelectronic devices to provide a high coupling efficiency and an increased thickness in other portions to fully encapsulate wire bond connections, for example. The method also provides for using the mechanical guides to align and couple optical fibers to the optoelectronic devices. In one exemplary embodiment, the end face of the optical fiber forms a conterminous interface with the top surface of the encapsulant, and the interface is obliquely angled with respect to the surface of the device die.

31 Claims, 11 Drawing Sheets

FIG. 6
SIDE VIEW

PLASTIC ENCAPSULATION OF OPTOELECTRONIC DEVICES FOR OPTICAL COUPLING

RELATED APPLICATION

This application claims priority of provisional application Ser. No. 60/260,633, filed on Jan. 8, 2001, entitled "Plastic Encapsulation of Optoelectronic Devices for Optical Coupling," the contents of which are herein incorporated by reference.

FIELD OF THE INVENTION

The present invention generally relates to optoelectronic communication systems. More particularly, the present invention relates to a method for encapsulating optoelectronic devices for optical coupling.

BACKGROUND OF THE INVENTION

Plastic encapsulation of optoelectronic devices may provide cost effective and reliable packaging schemes which otherwise may be more complicated, expensive and bulky. These packaging schemes, referred to as optical subassemblies (OSAs), are the mechanisms that enable the accurate positioning of optical fibers to provide for efficient optical coupling between optical fibers and optoelectronic devices such as VCSELs (vertical cavity surface emitting lasers), other lasers or photodetector devices.

A limitation associated with conventional encapsulation processes and designs, however, is that the precision of the conventional encapsulation processes is inadequate for many VCSEL and photodetector applications, specifically those which require high coupling efficiencies, dense packaging, high speed devices or a thin gap between the optoelectronic device and the optical fiber to which it is coupled. Conventional techniques are often not adequately precise because, using conventional technology, it is not possible to form the encapsulant by directly referencing the encapsulation molds to the optoelectronic devices themselves; rather, the encapsulation molds indirectly reference the devices through the lead frames or other media upon which the optoelectronic device is mounted. Therefore, using traditional encapsulation processes, even if the encapsulation mold references the lead frame perfectly, the variabilities of the lead frame itself, the alignment of the optoelectronic device to the lead frame, the variability in the die attach epoxy junction and the thickness variability of the optoelectronic device, may render it inherently difficult to achieve micron scale tolerances when shaping and positioning the encapsulant.

In optoelectronic coupling, an attractive optical train, especially for high-end optoelectronic devices such as VCSELs and P-i-N photodetectors that require high coupling efficiencies, is an optical train with the fewest variables. This may generally be achieved by directly "butt-coupling" the optoelectronic device to the optical fiber or other optical transmission medium. This is true for "pig-tailed" applications in which a section of the optical fiber is permanently attached to the OSA, or for "connectorized" applications where the optical fiber may be plugged into the OSA by utilizing industry standardized optical fiber connectors. When butt-coupling techniques are used to directly couple the optical fiber to an encapsulated optoelectronic device, the encapsulant typically must be precisely and accurately positioned over the optoelectronic device, in order to maximize optical coupling efficiency. Because of the above-described limitations, however, the plastic encapsulation of optoelectronic devices which are to be butt-coupled to optical fibers, is not practical using conventional encapsulation processes. As such, optoelectronic design engineers have been forced down alternate paths such as including lenses and hermetic TO cans, when coupling optoelectronic devices to optical fibers. The alternate arrangements may add variables to the optical train and are more costly and difficult to produce.

SUMMARY OF THE INVENTION

The present invention provides an apparatus and method for encapsulating an optoelectronic device on a substrate. In an exemplary embodiment, the encapsulant is formed over the optoelectronic device by forming an fluid encapsulant material over the optoelectronic device, then referencing the optoelectronic device or the optoelectronic device die during an alignment process used to shape the fluid encapsulant material into a shaped encapsulant. The shaped encapsulant may then be cured or otherwise hardened to form an appropriately solid shape. The encapsulant may be shaped to mate with a corresponding end face of an optical transmission medium. In another embodiment, the present invention further provides for directly butt-coupling an optoelectronic transmission medium to the encapsulated optoelectronic device to produce a butt-coupled connection with a high optical coupling efficiency. The butt-coupled connection is applicable to both pig-tailed and connectorized arrangements.

BRIEF DESCRIPTION OF THE DRAWINGS

The present invention is best understood from the following detailed description when read in conjunction with the accompanying drawings. It is emphasized that, according to common practice, the various features of the figures are not to-scale. On the contrary, the dimensions of the various features are arbitrarily expanded or reduced for clarity. Included in the drawings are the following figures:

FIGS. 3A–3C are cross-sectional views showing an exemplary molding tool forming an exemplary encapsulant over an optoelectronic device die.

FIGS. 5A and 5B are cross-sectional views showing another exemplary molding tool forming another exemplary encapsulant over an optoelectronic device die.

Like numerals denote like features throughout the specification and drawings.

DETAILED DESCRIPTION OF THE INVENTION

In an exemplary embodiment, the present invention provides for the plastic encapsulation of VCSELs, P-i-N photodetectors and other optoelectronic devices and that enables the use of the fundamentally desirable butt-coupled configuration, including with respect to connectorized OSAs where accurately butt-coupling an optical fiber to an optoelectronic device is often most challenging.

In particular, the present invention in one embodiment, provides an apparatus and method by which an encapsulant is formed on an optoelectronic device for optical coupling. The encapsulant is advantageously formed by directly referencing the optoelectronic device die or the optoelectronic device, and not the lead frame or other medium upon which the optoelectronic device die is mounted, when positioning the molding tool to shape the encapsulant. The encapsulant is accurately positioned with respect to the optoelectronic device and formed to a tightly controlled thickness. In an exemplary embodiment, the encapsulated optoelectronic device die is then butt-coupled to an optical transmission medium by aligning the optical transmission medium to the encapsulated optoelectronic device. The optoelectronic device may be an emitting optoelectronic device or a receiving optoelectronic device.

Figure 1:
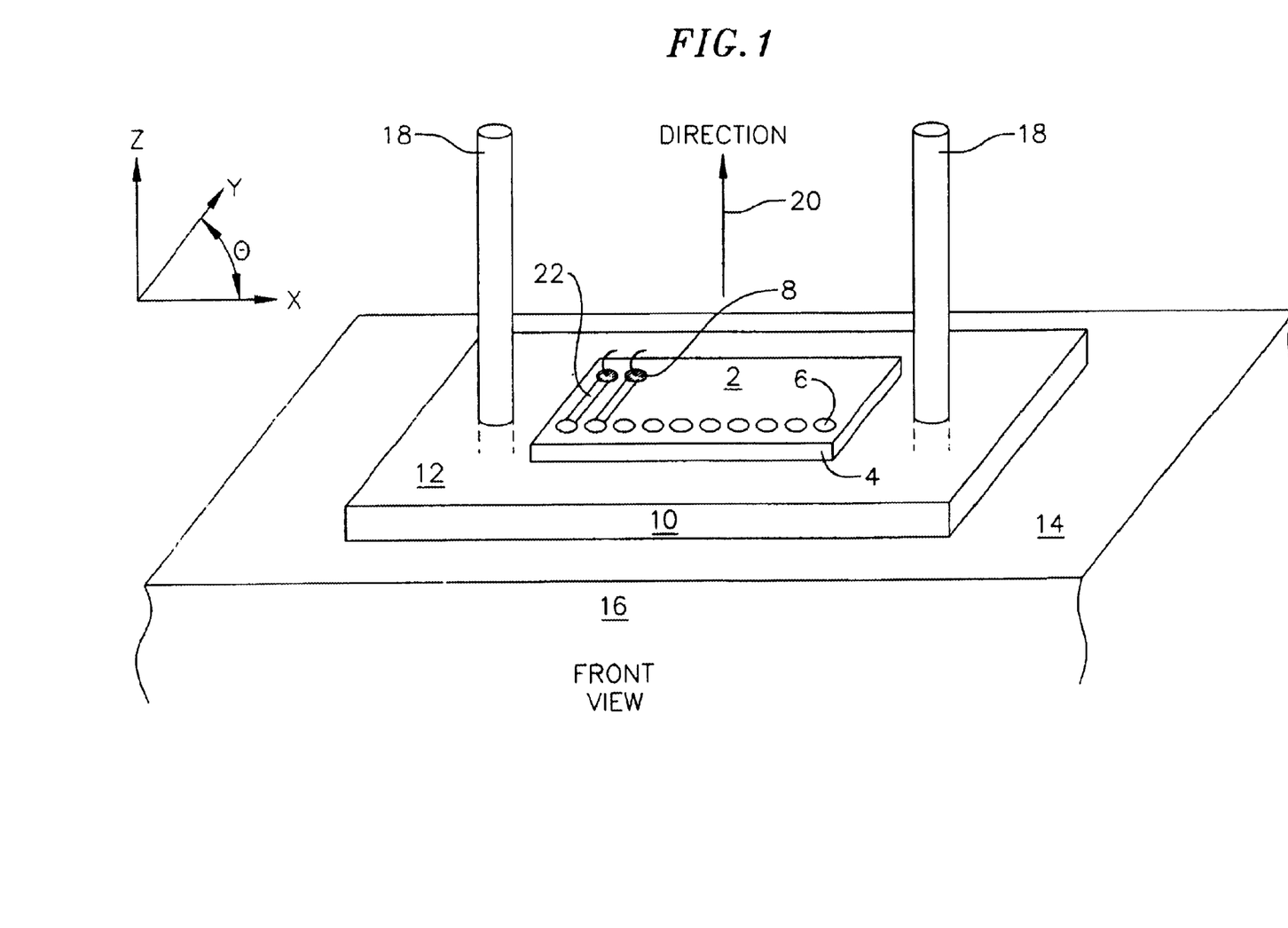
FIG. 1 is a perspective view showing an optoelectronic device die mounted on a substrate which includes mechanical guides.

FIG. 1 is a perspective view showing an optoelectronic device die mounted on an electrical substrate which, in turn, is mounted on a base substrate that may include mechanical guides for guiding a molding tool or encapsulating mold into position over the optoelectronic device.

FIG. 1 shows exemplary device die 4 that includes optoelectronic devices 6. The optoelectronic devices 6 may be short or long wavelength VCSELs according to various exemplary embodiments. The VCSELs may emit light at any of various wavelengths such as 850 nm, 1310 nm, or 1550 nm, for example. According to other exemplary embodiments, other lasers or photodetectors such as P-i-N photodetectors, may be used as optoelectronic devices 6. In an exemplary embodiment, the optoelectronic devices may be monolithic devices formed within a substrate and may be any of various emitting devices or receiving devices. For optoelectronic emitting devices, light is preferably emitted in a direction normal, or near normal, to substrate surface 2 such as along direction 20. For the case of an optical detector, transmitted light preferably travels toward the detector in a direction normal, or near normal, to substrate surface 2 such as opposite direction 20. According to the illustrated exemplary embodiment, device die 4 includes a linear array of eight optoelectronic devices 6 which may be VCSELs that emit light at 1310 nm, for example. According to other exemplary embodiments, the array may be a linear array of more or less than the eight individual optoelectronic devices 6 shown in FIG. 1, and the array may alternatively be a two dimensional array. According to one exemplary embodiment, device die 4 may include a single optoelectronic device 6. It should be therefore understood that the linear array of eight optoelectronic devices is intended to be exemplary only. According to another exemplary embodiment, device die 4 may include multiple monolithic optoelectronic devices, such as both a VCSEL and a monitor photodiode such as a P-i-N photodetector, formed in the same device die 4. The view shown in FIG. 1 is arbitrarily labeled a "Front View" and is intended only to clarify the relative orientation of the views shown in the other figures.

Device die 4 includes substrate surface 2 that is substantially planar in the exemplary embodiment. Device die 4 is mounted on upper surface 12 of electrical substrate 10. Electrical substrate 10 may be a printed circuit board, a ceramic, rigid flex, soft flex, or other type of board, or it may be a lead frame. Device die 4 may be affixed to electrical substrate 10 using various die attach methods such as epoxy, solder and flip chip mounting. Any of various other suitable conventional techniques may alternatively be used. Upper surface 12 of electrical substrate 10 is advantageously also a substantially planar surface. Electrical substrate 10 is mounted on surface 14 of base substrate 16. Base substrate 16 may be formed of suitable conventional materials. Electrical substrate 10 and base substrate 16 may be joined using conventional laser welding, epoxying, or other suitable methods, and in an exemplary embodiment, upper surface 12 and surface 14 may be parallel.

Device die 4 may advantageously be a semiconductor substrate formed of suitable substrate materials such as silicon, InP, GaAs, or other appropriate conventional materials. Optoelectronic devices 6 may be formed in or on substrate surface 2 of device die 4 using conventional methods. Optoelectronic devices 6 are wire bonded by means of wire bond 8 to other electrical components. Wire bond 8 is disposed distally from optoelectronic device 6 due to the presence of conductive traces 22 formed on substrate surface 2 and which electrically couple optoelectronic devices 6 to the corresponding wire bonds 8. Conductive traces 22 may be formed of gold, nickel or other suitable materials and may be formed using conventional methods. According to the exemplary embodiment in which a wedge-shaped encapsulant is formed over device die 4, the thicker portion of the encapsulant wedge will advantageously be disposed over wire bond 8 to ensure complete encapsulation of wire bond 8 while preferably allowing for a reduced thickness of the encapsulant over optoelectronic device 6 in order to provide more proximate butt-coupling of the optoelectronic device to the transmission medium, therefore producing a higher optical coupling efficiency. According to the exemplary embodiment in which device die 4 is flip-chip mounted upon electrical substrate 10, wire bonds 8 may not be needed.

Various techniques may be used to align a molding tool (not shown in FIG. 1) to device die 4 to form an encapsulant over optoelectronic devices 6. In the exemplary embodiment shown, base substrate 16 includes a set of mechanical guides 18 which are pins that include a generally round cross-section in the exemplary embodiment. Mechanical guides 18 are intended to be exemplary only and other mechanical guides may be used in other exemplary embodiments. Mechanical guides 18 may alternatively be various other relief features having various cross-sectional shapes. Mechanical guides 18 advantageously extend from base substrate 16 and are used to guide a molding tool shaped to receive the mechanical guides, into position over device die 4 to shape a volume of epoxy and encapsulate device die 4 and optoelectronic devices 6. Various numbers of mechanical guides may be used in other exemplary embodiments. In one exemplary embodiment, three mechanical guides may be used. Mechanical guides 18 may optionally be subsequently used to accurately position and couple an optical transmission medium such as an optical fiber secured within an optical ferrule, over the encapsulated device die 4. As such, in one embodiment, exemplary mechanical guides 18, are aligned very precisely with respect to the optoelectronic device or devices 6 formed on device die 4. In this embodiment, the alignment of the optoelectronic device array is aligned with respect to mechanical guides 18 in the x, y, and θ directions shown in FIG. 1. Mechanical guides 18 extend through electrical substrate 10 in the illustrated embodiment. According to other exemplary embodiments, mechanical guides 18 may be disposed adjacent electrical substrate 10, and the mechanical guides may take on any of various suitable configurations for guiding a molding tool that has suitable corresponding features to mate with the mechanical guides, into position over device die 4 and accurately aligned in the x, y, and θ directions with respect to device die 4 and optoelectronic devices 6.

According to one exemplary embodiment, mechanical guides 18 may additionally be used for joining and aligning device die 4 to electrical substrate 10. A placement tool, for example, may retain device die 4 for placement on upper surface 12 of electrical substrate 10. The placement tool may include cavities for receiving mechanical guides 18. In this exemplary embodiment, mechanical guides 18 are inserted within corresponding cavities in the placement tool and the placement tool is guided toward the substrate along mechanical guides 18 to accurately position device die 4 with respect to the x, y, and θ directions, on upper surface 12. Conventional means may be used to affix device die 4 to electrical substrate 10.

After optoelectronic device die 4 is affixed upon base substrate 16 and accurately positioned in the x, y, and θ directions with respect to mechanical guides 18, a volume of fluid encapsulant material is introduced to the arrangement in the exemplary embodiment. The volume of fluid encapsulant material is preferably formed over device die 4 and positioned using conventional methods. Various methods may be used to dispense the volume of fluid encapsulant material into position. The fluid encapsulant material may be a UV-curable epoxy, a temperature curable epoxy, a time curable epoxy, or other suitable epoxies and materials such as thermoplastic resins, curing gels and other suitable polymers. The epoxy may be a 1-part, 2-part or n-part epoxy. Exemplary epoxies include Dexter CNB753-24, Ablestick RP636-1 and EPO-TEK T6116-M. Exemplary thermoplastic resins include General Electric Ultems and Dexter Hysol MG-18. An exemplary curing gel is Nye Optical Products NYOGEL-433. Other exemplary encapsulant materials may be used in other exemplary embodiments. The encapsulant material is chosen in the exemplary embodiment to ultimately form a protective shell that may provide mechanical support upon curing. The encapsulant material may be a castable material with resistance to pitting and scratching, and that has a low coefficient of expansion upon curing. Moreover, the encapsulant material is chosen to be transmissive to the wavelength of light transmitted either from the optoelectronic device to the optical transmission medium, or vice versa. For example, as used in conjunction with VCSELs and other devices preferred in today's optoelectronics industry, the encapsulant material may be chosen to be transmissive to 850 nm, 1310 nm or 1550 nm wavelength light. Upon hardening such as by curing, the encapsulant may alternatively be referred to as a plastic encapsulant. As such, the expressions hardened encapsulant and plastic encapsulant may be used interchangeably hereinafter in referring to the encapsulant.

Figure 2:
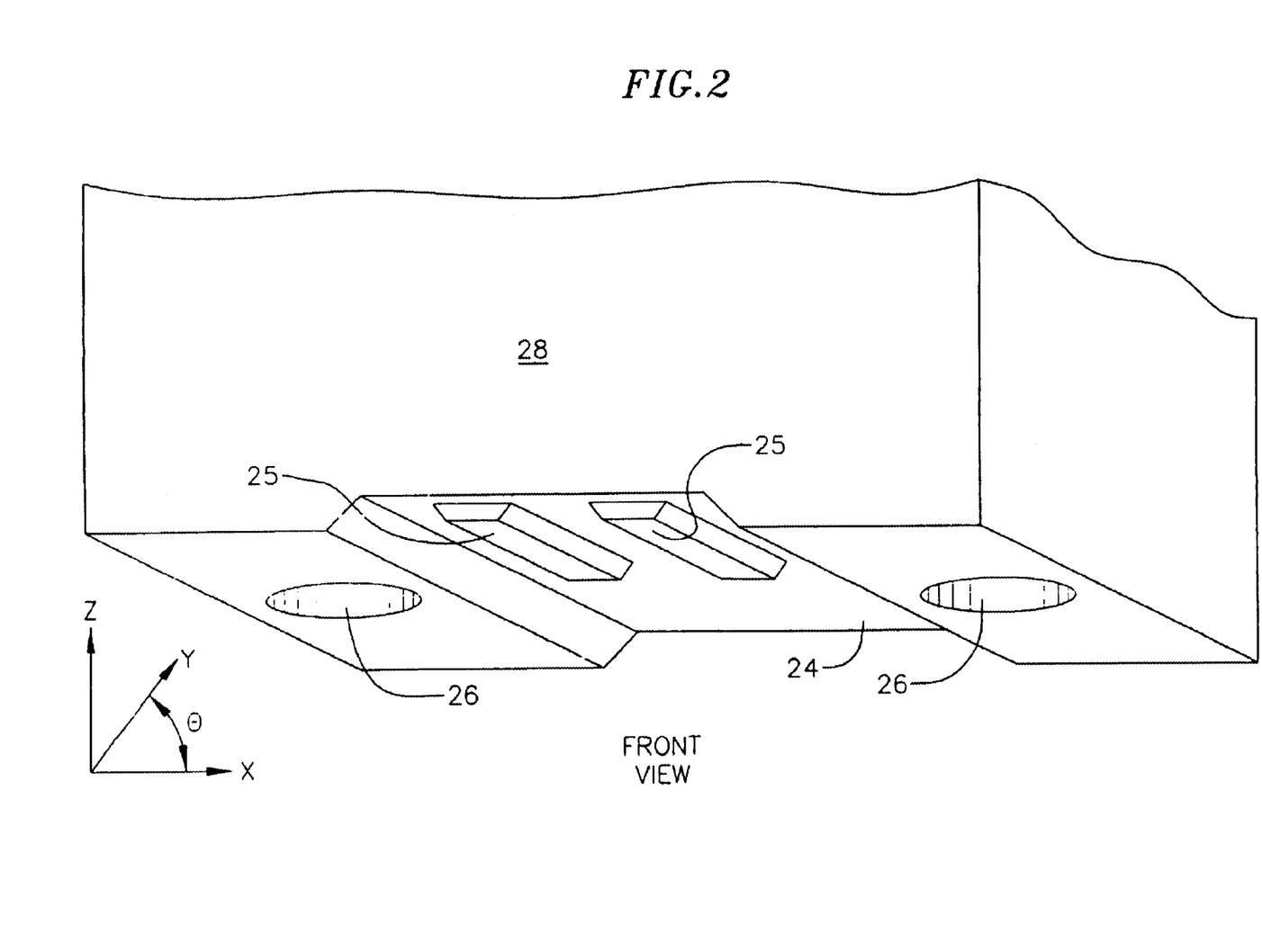
FIG. 2 is a perspective view of an exemplary molding tool.

After a volume of fluid encapsulant material is positioned over device die 4, a molding tool is used to shape the volume of fluid encapsulant material. The shaped encapsulant will be accurately aligned with respect to the optoelectronic device and will include a precisely controlled thickness. FIG. 2 is a perspective front view which shows an exemplary molding tool, alternatively referred to as an encapsulation mold. Encapsulation mold or molding tool 28 includes cavities 26 that correspond to mechanical guides 18. Mechanical guides 18 are fixed within a tight alignment tolerance in the x, y, and θ directions with respect to optoelectronic devices 6 formed on device die 4. As such, it can be understood that when molding tool 28 is slid along mechanical guides 18 after mechanical guides 18 are received within corresponding cavities 26, molding tool 28 is accurately positioned with respect to device die 4 and therefore optoelectronic devices 6, in the x, y and θ directions. The mechanical guide 18/cavity 26 arrangement of corresponding guiding features is intended to be exemplary only and various other mechanical guides or other relief features which cooperate with features formed on or in a molding tool, can be used to accurately position molding tool 28 with respect to device die 4 in the x, y and θ directions.

In an exemplary embodiment, the present invention also provides for actively aligning molding tool 28 to the optoelectronic devices 6 in the z-direction by directly referencing device die 4 and/or optoelectronic devices 6. According to the exemplary embodiment shown in FIG. 2, molding surface 24 contacts and shapes the volume of fluid encapsulant material when molding tool 28 is urged to a predetermined alignment position along the z axis by referencing device die 4. Molding surface 24 includes exemplary protrusions 25 which preferably contact device die 4 when molding tool 28 is aligned in the z-direction and in its predetermined alignment position for shaping the encapsulant. The embodiment shown in FIG. 2 is intended to be exemplary only and, according to other exemplary embodiments, molding surface 24 may be contoured and shaped to include other protrusions or relief features which may reference and/or contact substrate surface 2, device die 4 and/or upper surface 12 when molding tool 28 is in its alignment position for shaping the encapsulant. According to another exemplary embodiment, means other than protrusions formed on the molding tool may be used to position molding tool 28 in its predetermined z-position. For example, various sensors may be included on molding tool 28 to finally position or assist in positioning molding tool 28 in its alignment position along the z-axis. Protrusions 25 or other exemplary relief features may additionally aid in fine alignment between molding tool 28 and device die 4 in the x, y and θ directions by referencing physical features on substrate 16, such as device die 4 or optoelectronic devices 6. According to an exemplary embodiment, molding tool 28 may additionally or alternatively include sensors to aid in such fine alignment.

In an exemplary embodiment, molding surface 24 is contoured to accurately shape the volume of fluid encapsulant material into a shaped encapsulant. Molding surface 24 may additionally include raised sections which produce recessed portions in the top surface of the permanently shaped encapsulant. Exemplary raised sections will be shown in FIGS. 5A and 5B. Prior to translating molding tool 28 along mechanical guides 18 and into a predetermined alignment position with respect to device die 4, molding surface 24 may be optionally coated with a suitable release agent to ensure a clean release of molding surface 24 from the encapsulant after the encapsulant is shaped. The release agent may be any of various conventional release agents, chosen in conjunction with the epoxy used and applied to molding surface 24 using conventional means.

According to another exemplary embodiment, vision-based alignment may be used exclusively, and the mechanical guides and corresponding cavities are not needed. The vision-based alignment technique may include sensors to provide for vision-based motion and final positioning of the molding tool relative to the device die using camera imaging or other techniques. Such vision-based alignment techniques may include referencing the device die and/or the optoelectronic device or devices to finally position molding tool in the x, y, z and θ directions, with respect to the device die and the optoelectronic devices.

Figure 3A:
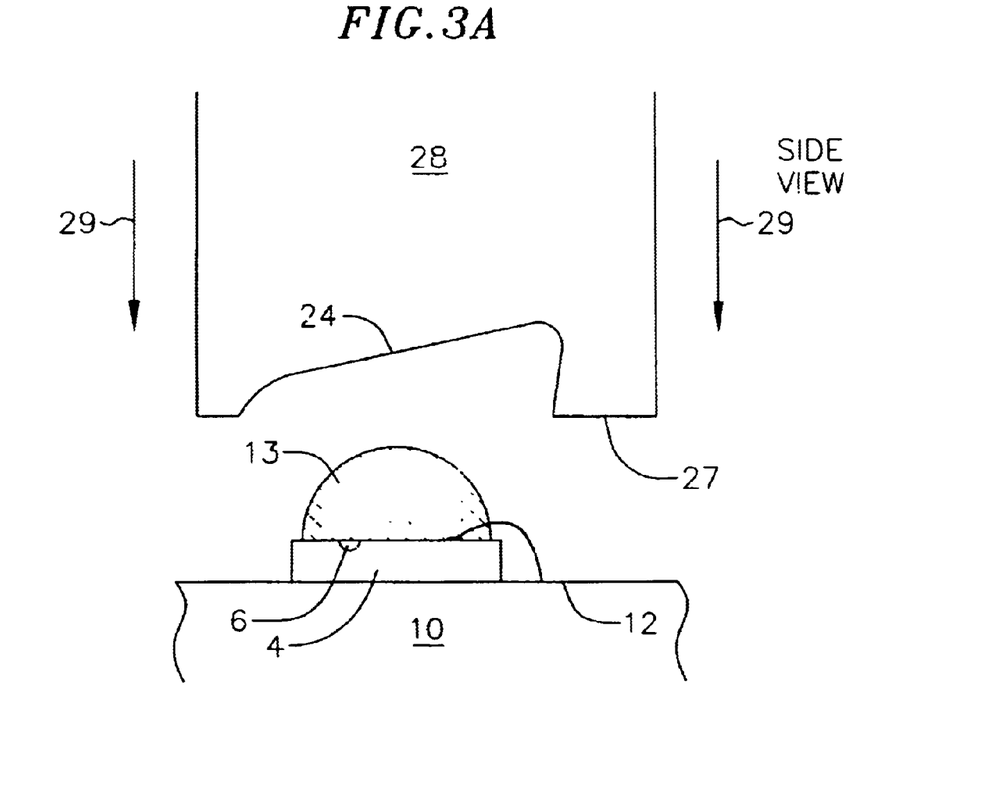
FIG. 3A is a side view showing the molding tool positioned over the optoelectronic die.

FIG. 3A is a cross-sectional side view showing exemplary molding tool 28 positioned over device die 4. Molding tool 28 is preferably translated along direction 29 towards the device die 4/electrical substrate 10 arrangement. Fluid encapsulant material 13 is formed over device die 4. At this point, the mechanical guides 18 shown in FIG. 1, will have mated with corresponding features such as cavities 26 formed in molding tool 28 and shown in FIG. 2, in order to accurately guide molding tool 28 into position and accurately align molding tool 28 to device die 4 with respect to the x, y and θ directions, as will be shown in FIG. 3C. Molding tool 28 is translated along direction 29 until it achieves its desired predetermined alignment position with respect to the z axis, by referencing device die 4. In an exemplary embodiment, no further alignment is necessary in the x, y and θ directions, once molding tool 28 achieves its correct alignment position in the z-direction.

In an exemplary embodiment, molding tool 28 is translated along mechanical guides 18 until it reaches a predetermined alignment position along the z-axis by actively referencing device die 4 and/or optoelectronic devices 6. This predetermined position may be achieved when a portion of molding tool 28 mechanically contacts a portion of device die 4 and/or upper surface 12 of electrical substrate 10 or it may be achieved when molding tool 28 is not in contact with device die 4 or upper surface 12. For example, protrusions such as protrusions 25 shown in FIG. 2, protuberances 27 shown in FIG. 3A or other relief features, may contact either substrate surface 2, device die 4 or upper surface 12 of electrical substrate 10 when molding tool 28 has reached its alignment position for shaping fluid encapsulant 13, or molding tool 28 may be retracted a specified distance after physically contacting device die 4 and may therefore be spaced above device die 4 when in its final position for shaping fluid encapsulant 13. Sensors may aid in determining when contact is made between relief features of molding tool 28 and features such as device die 4, or when molding tool 28 is otherwise accurately aligned in the z-direction, with respect to optoelectronic devices 6.

According to another exemplary method for achieving the desired position along the z-axis, other suitable positioning means such as laser interferometry and vision-based techniques may be used to position and align molding tool 28, by referencing device die 4 and/or optoelectronic devices 6. Various sensors may be used to aid in exemplary vision-based positioning and alignment techniques. Various conventional mechanical means may be used to urge molding tool 28 into the predetermined alignment position for shaping the encapsulant.

Figure 3B:
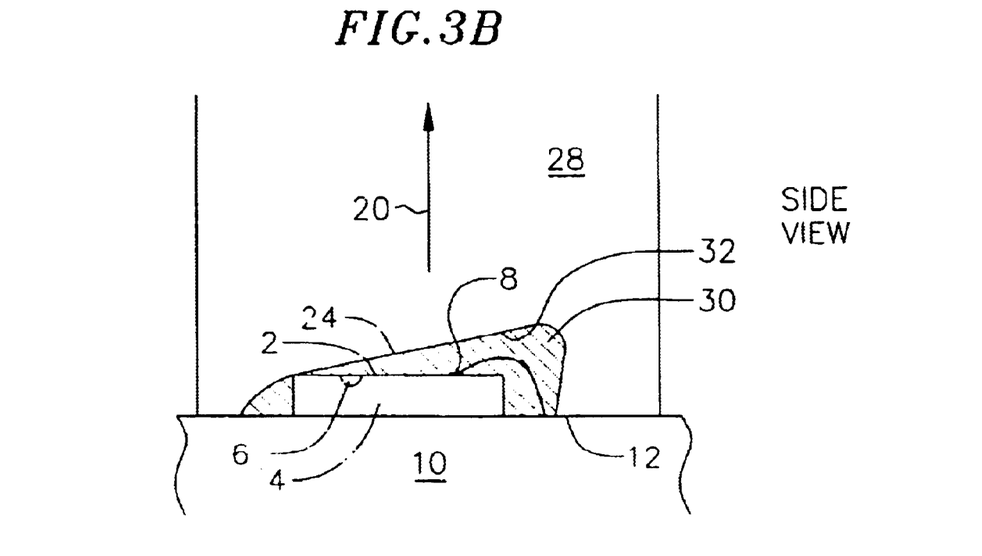
FIG. 3B is a side view showing the molding tool shaping the encapsulant.

FIG. 3B is a cross-sectional side view showing molding tool 28 brought into its final alignment position along the z-axis with respect to device die 4. In the exemplary embodiment shown, protuberances 27 contact upper surface 12 but, according to other exemplary embodiments other protuberances or relief features may directly contact device die 4, or molding tool 28 may be spaced above the device die 4/electrical substrate 10 arrangement when in the final predetermined position for shaping the encapsulant. Shaped encapsulant 30 is molded into a regularly-shaped configuration according to an exemplary embodiment. In the exemplary embodiment shown in side view, shaped encapsulant 30 is shaped into a wedge-shaped configuration which extends laterally beyond device die 4. Molding surface 24 of molding tool 28 is oblique to each of surface 12 of electrical substrate 10 and substrate surface 2 of device die 4. Furthermore, in this embodiment, it can be seen that top surface 32 of shaped encapsulant 30 is oblique to direction 20. The wedge shape of shaped encapsulant 30 is intended to be exemplary only and other shapes such as a rectangular "platform" shape in which top surface 32 is substantially parallel to substrate surface 2 and upper surface 12, may be used in other exemplary embodiments. According to yet another exemplary embodiment, top surface 32 may be non-planar. Shaped encapsulant 30 is formed accurately aligned with respect to optoelectronic device 6 within a tight alignment tolerance along the x, y and θ directions and includes a precisely controlled thickness.

According to the angled wedge embodiment shown, it can be seen that shaped encapsulant 30 includes a greater thickness in the area over wire bond 8 than in the area over optoelectronic device 6 shown in the exemplary embodiment. In this embodiment, this provides for at least two advantages: (1) the thickness in the wire bond area is sufficient to ensure that wire bond 8 is completely encased, while (2) the thickness of shaped encapsulant 30 over optoelectronic device 6 is sufficiently thin to preferably ensure high optical coupling efficiency when the optoelectronic device is subsequently coupled to an optical fiber or other optical transmission medium. This is enabled by spacing apart optoelectronic device 6 from wire bond 8. Wire bond 8 couples optoelectronic device 6 by means of conductive trace 22 to other conductive traces or further electronic components (not shown) on or through electrical substrate 10.

Figure 3C:
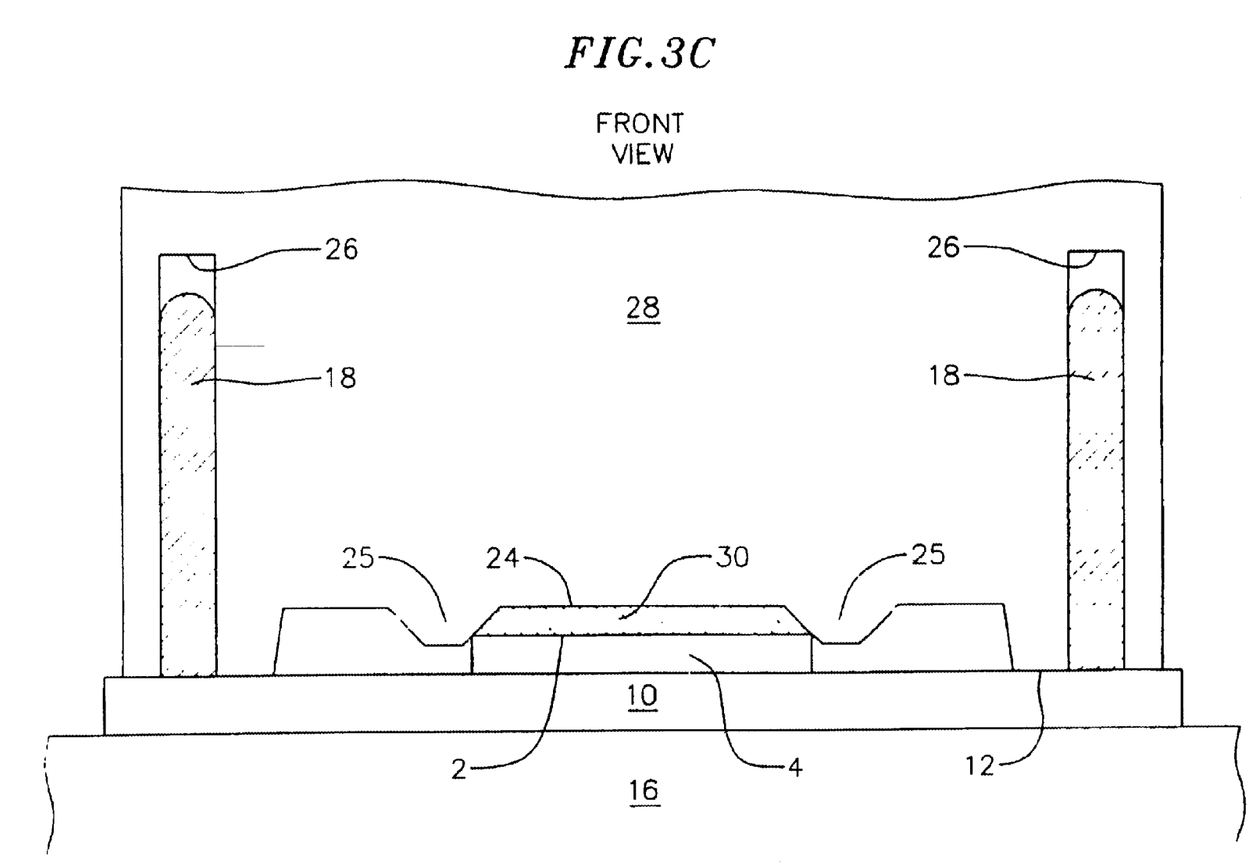
FIG. 3C is a front view showing the molding tool positioned over and contacting the optoelectronic device die.

FIG. 3C is an exemplary cross-sectional front view of molding tool 28 in an exemplary final position for shaping encapsulant 30. Mechanical guides 18 are preferably received snugly within corresponding cavities 26 to provide x, y, θ alignment. Protrusions 25 reference and contact device die 4 to position molding tool 28 in its alignment position in the z-direction. Since protrusions 25 of molding tool 28 actively align molding tool 28 to device die 4, shaped encapsulant 30, shaped by molding surface 24, is accurately aligned with respect to device die 4 and includes a tightly controlled thickness as will be shown in FIG. 4.

After molding tool 28 has achieved its predetermined alignment position such that molding surface 24 has shaped the encapsulant, the encapsulant is cured. In one exemplary embodiment, the shaping process at least partially solidifies the shaped encapsulant and the curing further solidifies and preferably hardens the shaped encapsulant. According to another exemplary embodiment, the curing process essentially solidifies the shaped encapsulant 30. Conventional curing means may be used and will depend upon the encapsulant material used. UV-curing, thermal curing or time curing may be used according to various exemplary embodiments. The curing process may take place while molding tool 28 is still in place or after molding tool 28 has been retracted. After shaped encapsulant 30 is solidly formed, and preferably hardened to a suitable rigidity, molding tool 28 is preferably removed from the hardened or plastic encapsulant.

Figure 4:
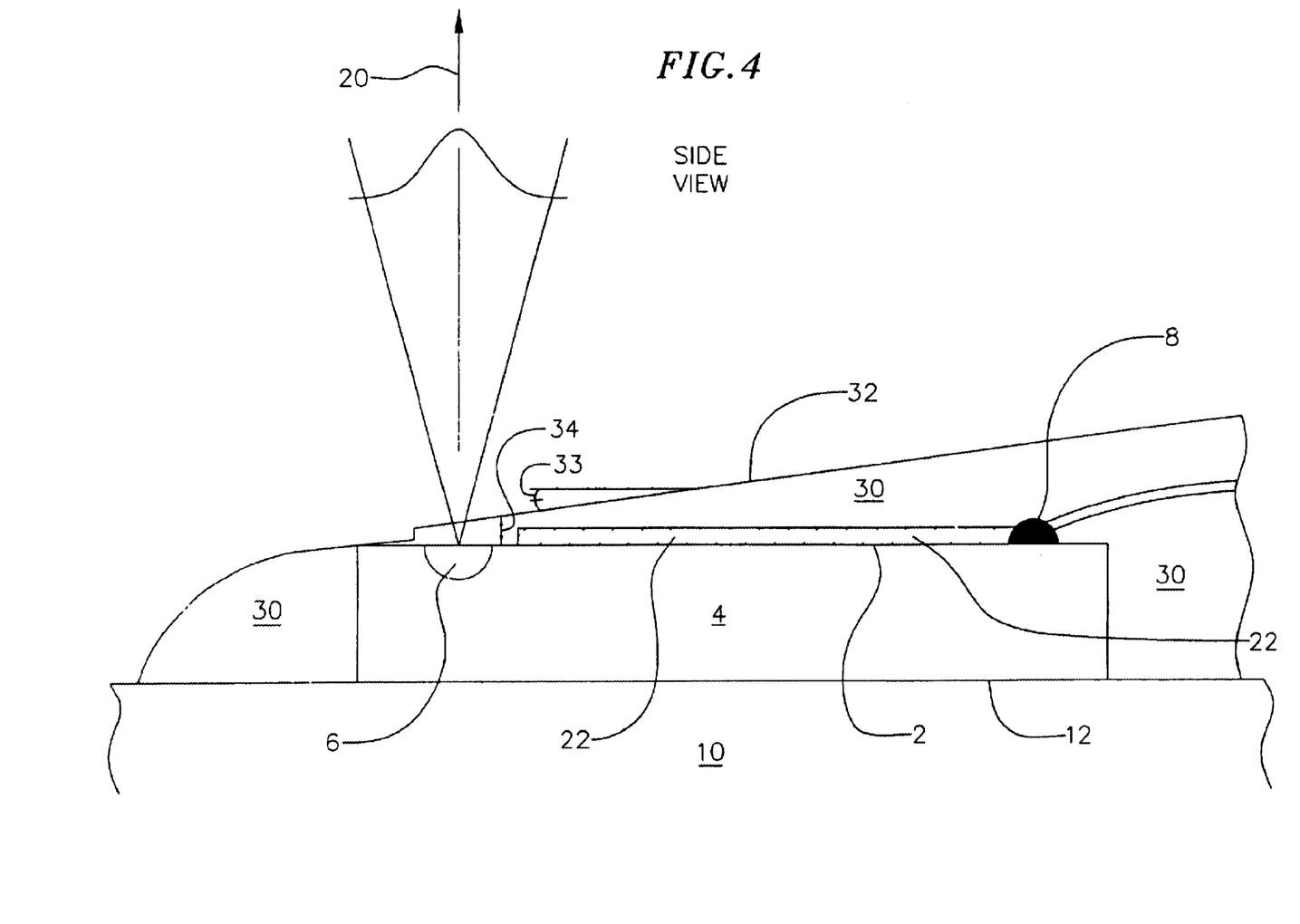
FIG. 4 is a cross-sectional view showing an optoelectronic device die covered with an exemplary encapsulant.

FIG. 4 is a cross-sectional side view showing additional details of the plastic encapsulant formed over device die 4. Shaped and cured plastic encapsulant 30 is formed over device die 4, extends laterally beyond device die 4, and includes a wedge shape according to the exemplary embodiment. According to other exemplary embodiments, top surface 32 may be parallel to substrate surface 2 or it may be a non-planar surface. The exemplary illustrated top surface 32 is generally flat and angled or oblique with respect to substrate surface 2 of device die 4 and also with respect to direction 20. Direction 20 is generally normal to substrate surface 2. Shaped and cured encapsulant 30 is a hardened, protective member that encases optoelectronic device 6 and also encases device die 4 in the exemplary embodiment. In an exemplary embodiment, angled upper surface 32 forms angle 33 with substrate surface 2 ranging from 4° to 12°, but other configurations may be used alternatively. The thickness of plastic encapsulant 30 is preferably chosen to completely encase wire bond 8 and is reduced in regions over optoelectronic device 6. According to an exemplary embodiment, thickness 34 of plastic encapsulant 30 over optoelectronic device 6 may lie within the range of 20–100 micrometers and may be 35 micrometers in one embodiment in which optoelectronic device 6 is an emitting device, but other thicknesses may be used in other exemplary embodiments. According to the exemplary embodiment in which optoelectronic device 6 is a receiving device, thickness 34 may be greater than used for an emitting device. According to an exemplary embodiment in which the upper surface of the plastic encapsulant is substantially parallel to substrate surface 2 of device die 4, the encapsulant thickness is chosen to completely encase any wire bonds formed on substrate surface 2 while being thin enough to ensure good optical coupling efficiency. According to other exemplary embodiments, plastic encapsulant 30 may include a top surface that is non-planar, irregularly shaped, or that contains recesses. In an exemplary embodiment in which device die 4 is coupled to underlying electrical substrate 10 by flip chip mounting, and in which wire bonding on surface 2 of device die 4 is therefore not required, the thickness of plastic encapsulant 30 may be chosen to be sufficiently thin to provide for high optical coupling efficiency.

In an exemplary embodiment, FIG. 4 may represent a side view of an array of optoelectronic devices 6 such as shown on FIG. 1. The array may be a linear array that extends in and out of the plane of the figure. In an exemplary embodiment, optoelectronic devices 6 may be single mode VCSELs emitting at 1310 nm, but VCSELs emitting at other wavelengths and other optoelectronic devices may be used alternatively.

Figure 5A:
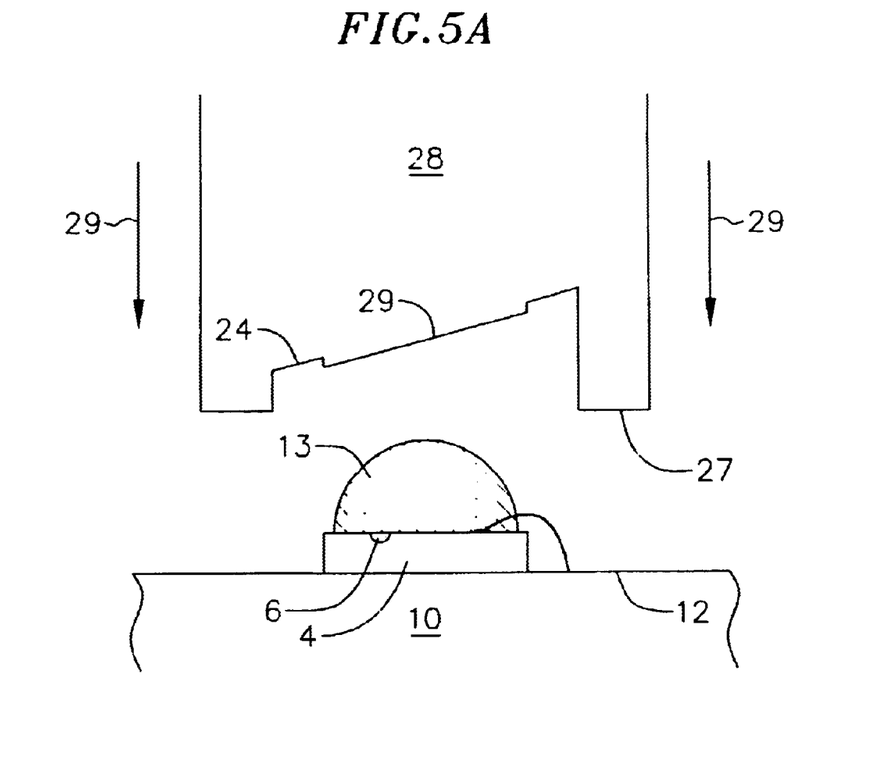
FIG. 5A shows the molding tool positioned over the optoelectronic device die and FIG. 5B shows the molding tool shaping the encapsulant.
Figure 5B:
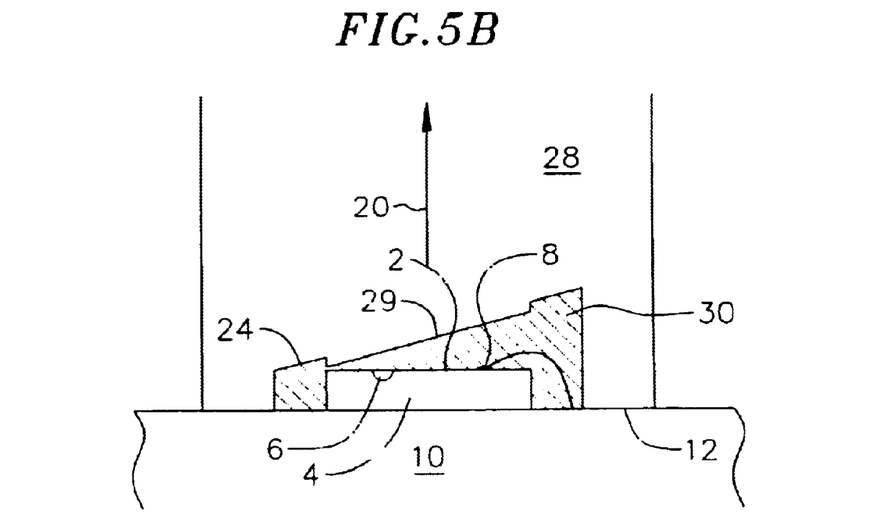

FIGS. 5A and 5B are comparable to FIGS. 3A and 3B and are as described in conjunction with FIGS. 3A and 3B in which like numerals denote like features. The exemplary embodiment shown in FIGS. 5A and 5B includes molding surface 24 of molding tool 28 including raised portion 29 which results in a corresponding recessed portion being formed in the top surface of the shaped, plastic encapsulant. An exemplary encapsulant such as may be formed by exemplary molding surface 24 shown in FIGS. 5A and 5B, is shown in FIG. 6.

Figure 6:
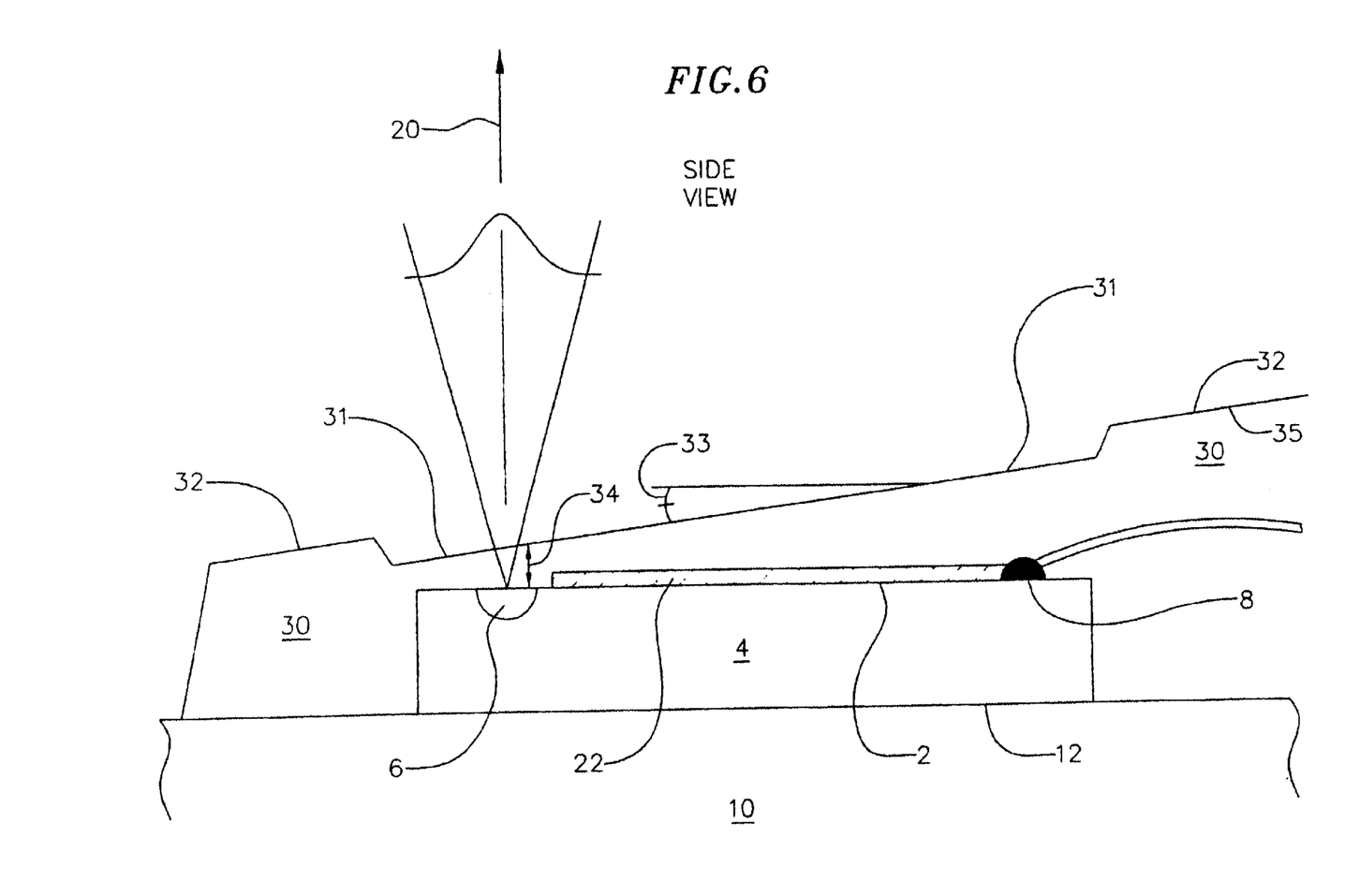
FIG. 6 is a cross-sectional view showing an optoelectronic device die covered with an exemplary encapsulant.

The exemplary shaped encapsulant shown in FIG. 6 includes recessed portion 31 of angled top surface 32 of shaped encapsulant 30. Recessed portion 31 is positioned over device die 4, more particularly, over optoelectronic device 6. Top surface 32 also includes peripheral portion 35. According to this exemplary encapsulant embodiment, recessed portion 31 is also angled or oblique with respect to substrate surface 2 of device die 4 and also with respect to direction 20 which is generally normal to substrate surface 2. In this exemplary embodiment, recessed portion 31 is generally parallel to generally flat angled peripheral portion 35 of top surface 32, but other configurations may be used alternatively. Recessed portion 31 may be recessed on the order of tens to hundreds of micrometers with respect to angled top surface 32, but other depths may be used in other exemplary embodiments. Recessed portion 31 desirably minimizes the mechanical stress applied to device die 4 when the arrangement is coupled to an optical ferrule as will be shown in FIG. 10.

Figure 7:
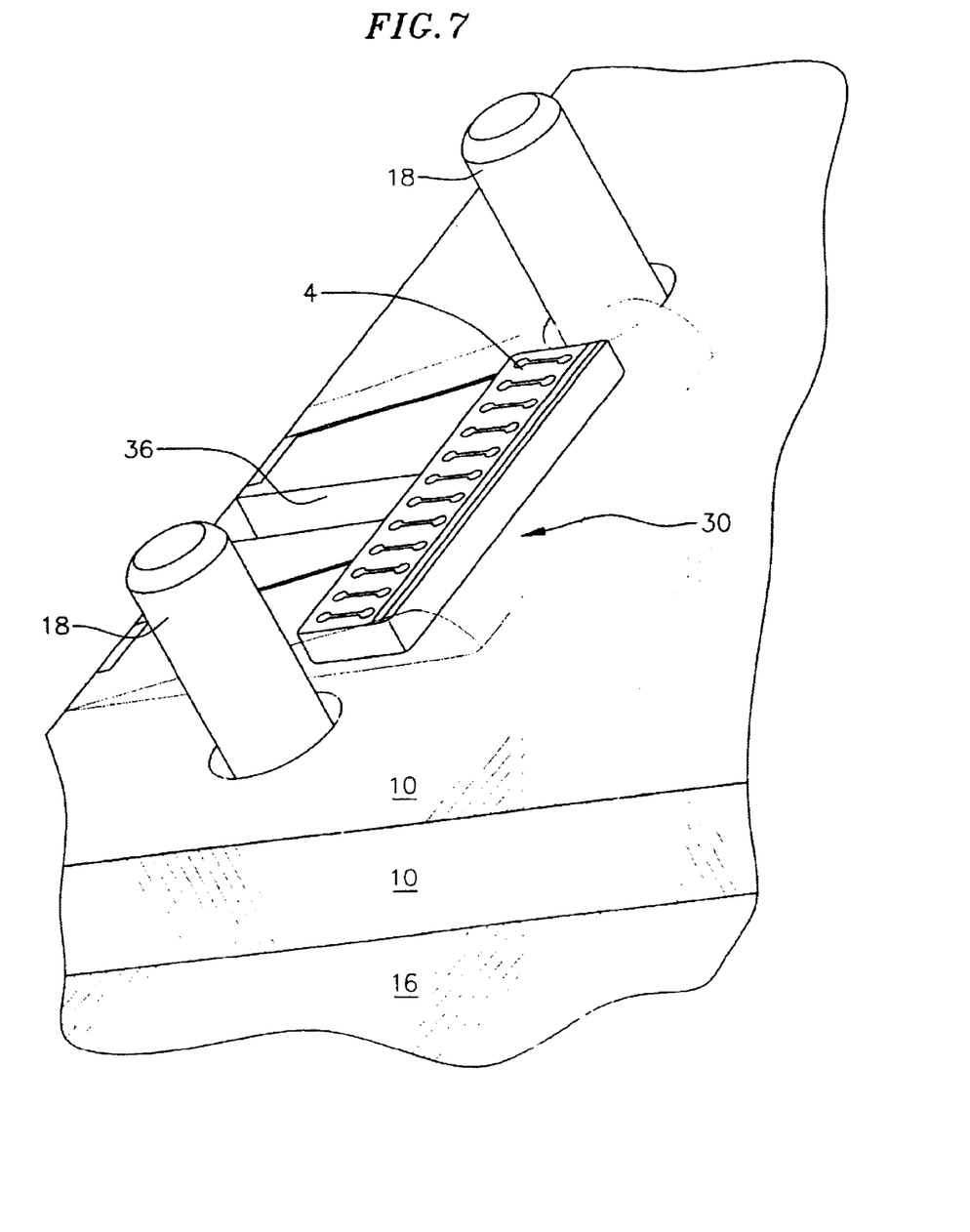
FIG. 7 is a perspective view of an encapsulated optoelectronic device die mounted on a substrate which includes mechanical guides.

FIG. 7 is a perspective view showing exemplary plastic encapsulant 30 formed over device die 4 which is preferably disposed between exemplary mechanical guides 18 and over base substrate 16. In the exemplary embodiment shown in FIG. 7, channel 36 is formed within electrical substrate 10 and extends beneath device die 4. According to the illustrated exemplary embodiment in which the optoelectronic die includes a VCSEL or VCSELs, channel 36 may include a monitor photodiode (obscured and therefore not shown in FIG. 7) disposed beneath a bidirectional emitting VCSEL to monitor light emitted by the VCSEL.

Figure 8:
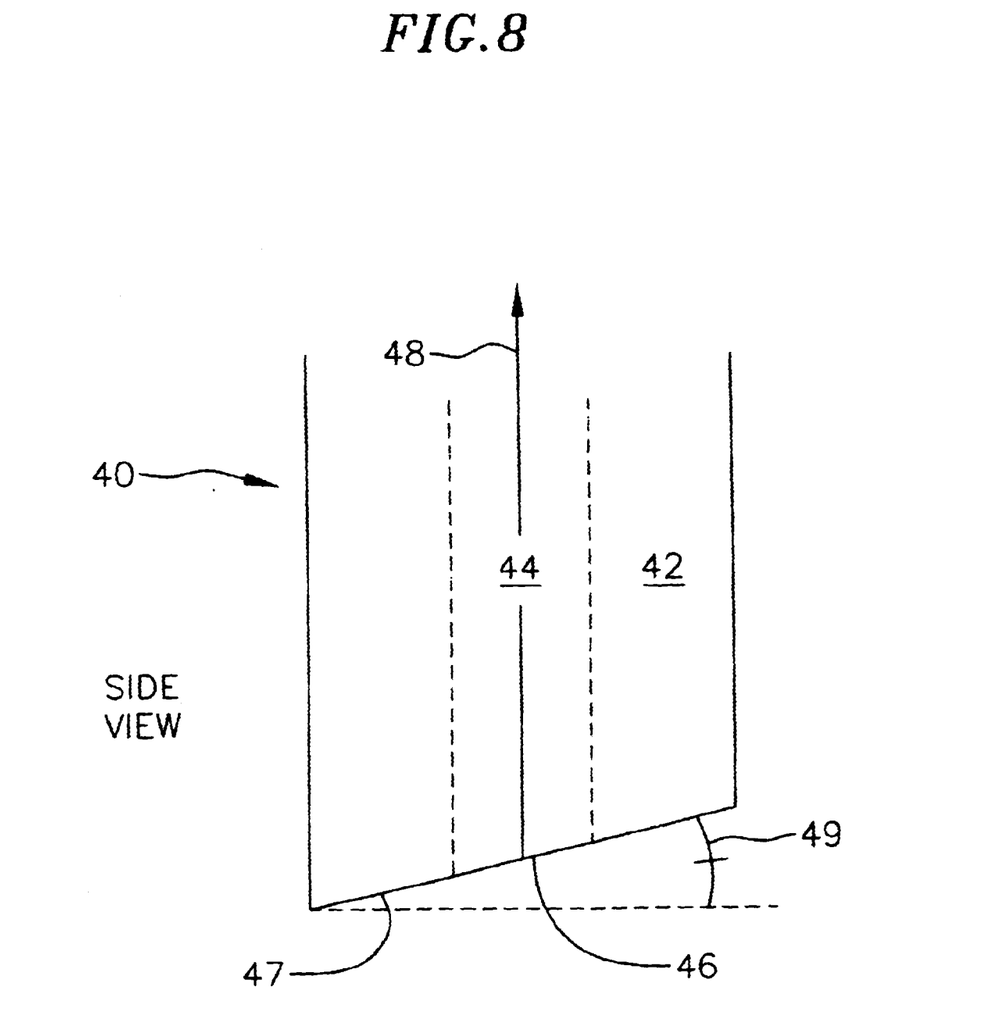
FIG. 8 is a side view of an optical ferrule having an angled end face.

FIG. 8 is a cross-sectional side view of an exemplary optical transmission medium which is shaped to be advantageously coupled to a wedge-shaped plastic encapsulant such as the exemplary shaped plastic encapsulants shown in FIGS. 4 and 6. Optical transmission device 40 includes optical ferrule 42 surrounding optical transmission medium 44. In an exemplary embodiment, optical ferrule 42 may be an MT ferrule. Optical transmission medium 44 may be an optical fiber as will be referred to hereinafter, but other optical transmission media may be used alternatively. Optical fiber 44 may be a single mode or multimode fiber. Direction 48 is the preferred direction along which light is propagated and is the axial direction of optical fiber 44. End face 46 of optical fiber 44 and end face 47 of optical ferrule 42 may be shaped to be non-orthogonal to direction 48 in the exemplary embodiment. End faces 46 and 47 are shaped to complement the upper surface of the plastic encapsulant such as angled upper surface 32 shown in FIGS. 4 and 6. According to one exemplary embodiment, optical ferrule 42 may be polished such that end face 46 forms an 8° angle 49 with the normal to direction 48, but other values of angle 49 may be used alternatively. According to other exemplary embodiments in which the top surface of the plastic encapsulant formed above the optoelectronic device die is substantially parallel to the top surface of the optoelectronic device die, end face 46 will be substantially perpendicular to axis direction 48 of optical fiber 44. End face 46 is shaped to ensure that when optical fiber 44 of optical transmission device 40 is butt-coupled to the optoelectronic device by placing end face 46 in confronting relationship with the upper surface of the plastic encapsulant, the preferred direction of light transmission—axis direction 48 of optical fiber 44—is disposed substantially parallel to the direction along which light is primarily emitted by the optoelectronic device. This direction is typically normal to the surface in which the emitting optoelectronic device is formed such as direction 20 shown in FIG. 1. This configuration is also true for optoelectronic detector devices which are formed to absorb light optimally directed normal to the surface on which the optoelectronic detector is formed. In each case, the simplest optical train possible may be achieved and optical coupling efficiency may be maximized.

According to an exemplary embodiment, FIG. 8 may represent a side view of an array of optical fibers, the array extending in and out of the plane of the figure and corresponding to an array of optoelectronic devices formed on the substrate.

Figure 9:
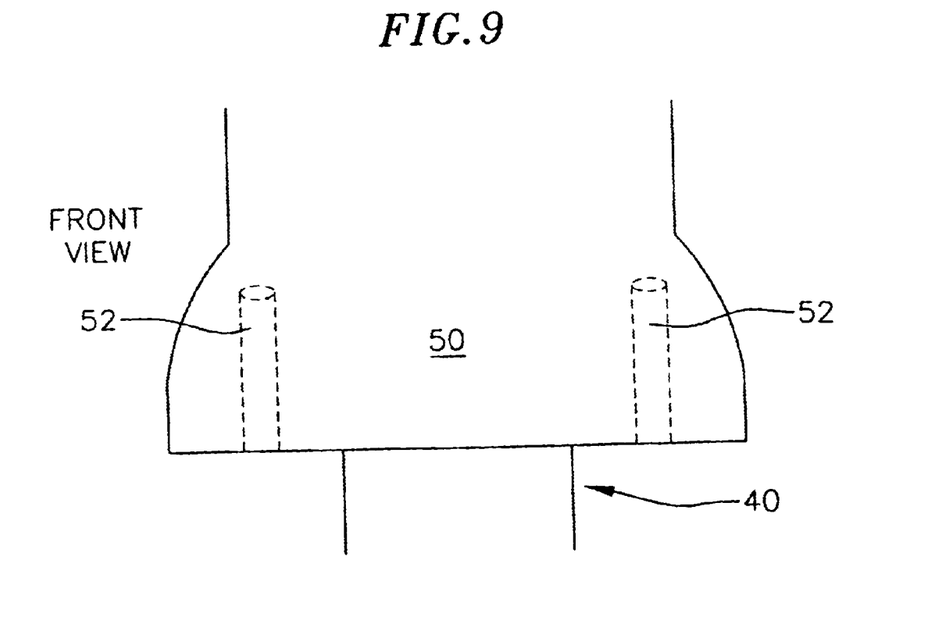
FIG. 9 is a front, plan view of an optical ferrule contained within an optical connector.

FIG. 9 shows optical transmission device 40 formed within exemplary optical connector 50. Exemplary optical connector 50 includes cavities 52 that are preferably formed to mate with mechanical guides 18 shown in FIG. 1. Mechanical guides 18, such as the exemplary pins shown in FIG. 1, thereby serve a dual purpose in this embodiment: they allow for molding tool 28 to be precisely positioned with respect to device die 4 so that plastic encapsulant 30 may be shaped and formed in precise relationship with device die 4, and they also guide optical connector 50 into position. According to one exemplary embodiment, optical connector 50 is slid along mechanical guides 18 until the end face of the optical ferrule 42 and/or optical fiber 44 contacts encapsulant 30, which acts as a mechanical stop.

Figure 10:
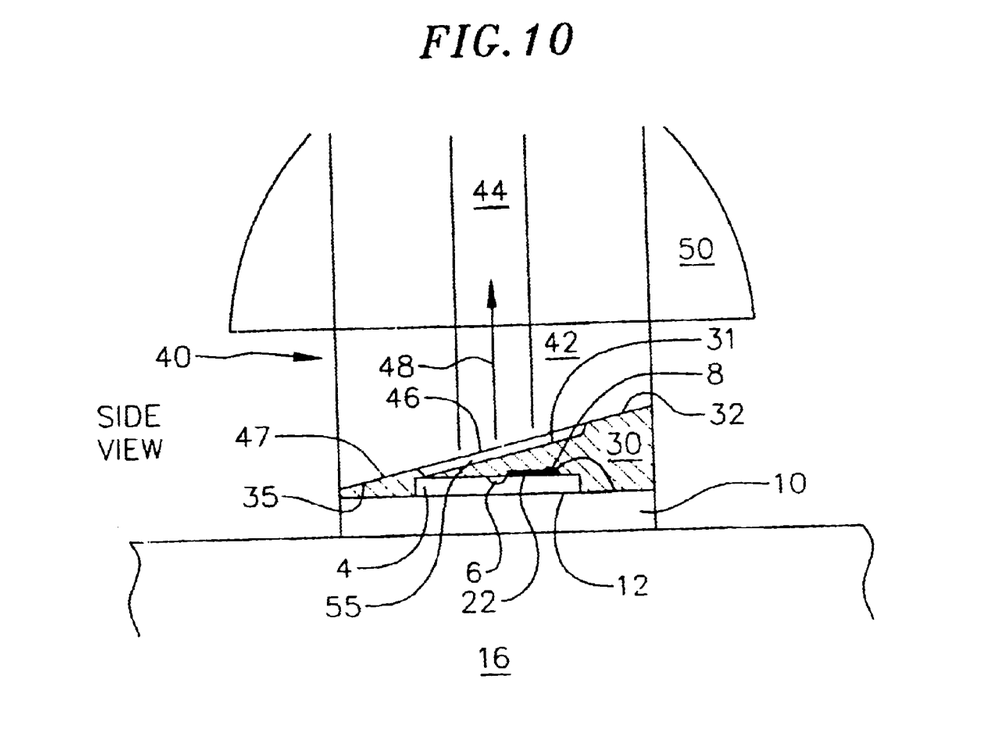
FIG. 10 is a cross-sectional view showing an optoelectronic device die encapsulated by an exemplary angled encapsulant and coupled to an optical transmission medium.

FIG. 10 is a cross-sectional side view of an exemplary embodiment in which optical transmission device 40 is butt-coupled to optoelectronic device 6 by positioning angled end faces 46 and 47 of optical fiber 44 and optical ferrule 42, respectively, in confronting relation with angled top surface 32 of plastic encapsulant 30. Angled end faces 46 and 47 are substantially parallel to top surface 32. In the exemplary embodiment shown, angled top surface 32 includes recessed portion 31 which results in void 55 formed when angled end face 46 of optical fiber 44 mates with peripheral portion 35 of top surface 32. This arrangement advantageously suppresses stress in device die 4 when the components are coupled. According to other exemplary embodiments, recessed portion 31 may not be used. The thickness of plastic encapsulant 30 is greater in the region over wire bond 8 than in the region over optoelectronic device 6. Angled top surface 32 of molded plastic encapsulant 30, specifically, peripheral portion 35, and portions of end face 47 of optical ferrule 42 are disposed in confronting relation and, in an exemplary embodiment, form a conterminous interface. The conterminous interface is oblique with respect to substrate surface 2 and upper surface 12. Furthermore, in the exemplary embodiment, recessed portion 31 is also oblique with respect to substrate surface 2 and upper surface 12. Moreover, the interface is oblique with respect to direction 48, which is the axial direction of optical fiber 44 and represents the direction along which light is preferably travels when emitted by optoelectronic device 6 or directed to monitoring optoelectronic device 6. Optical ferrule 42 is secured within optical connector 50. In the side view shown in FIG. 10, only one optoelectronic device of the optoelectronic device array is shown. Furthermore, only one corresponding optical fiber 44, conductive trace 22 and wire bond 8 are shown. In an exemplary array of optoelectronic devices (not shown) which extends in and out of the plane of the drawing, however, each optoelectronic device includes a corresponding optical fiber, conductive trace and wire bond.

Figure 11:
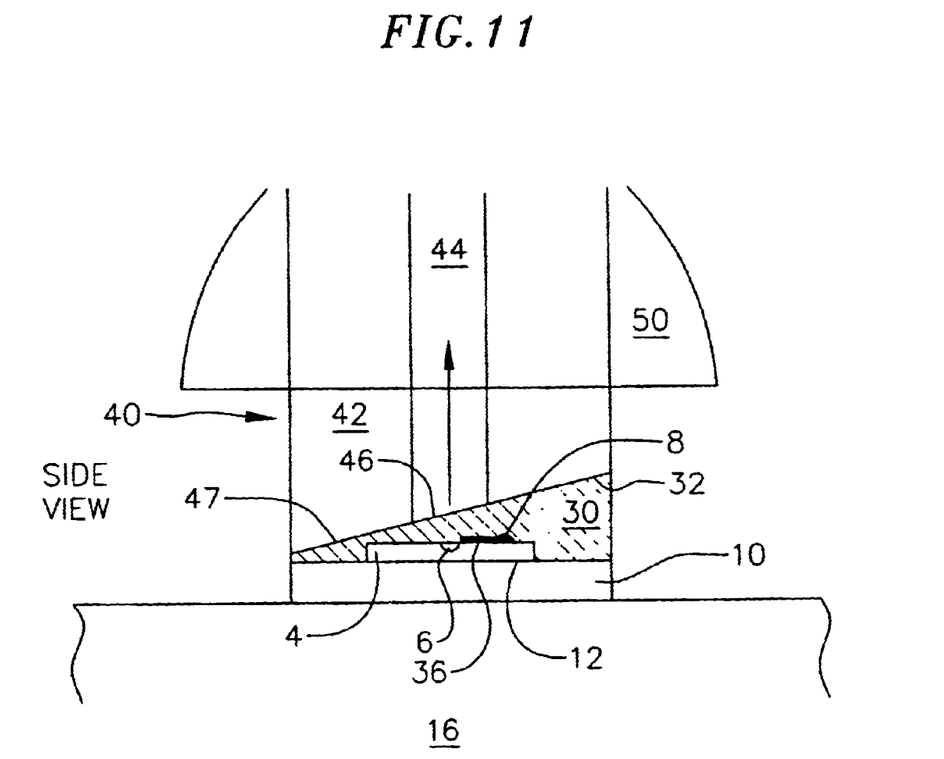
FIG. 11 is a cross-sectional view showing an optoelectronic device die encapsulated by another exemplary angled encapsulant and coupled to an optical transmission medium.

FIG. 11 is a cross-sectional side view which is comparable to the illustration of FIG. 10, with the distinction being that the angled top surface 32 of plastic encapsulant 30 is generally planar and does not include a recessed portion. End faces 46 and 47 are parallel to top surface 32. End face 46 of optical fiber 44 forms a substantially conterminous interface with angled top surface 32 of plastic encapsulant 30 formed over device die 4.

According to the exemplary embodiments shown, plastic encapsulant 30 may advantageously serve to protect the optoelectronic device environmentally and physically and optionally acts as a mechanical stop for positioning the optical fibers. As discussed above, various methods may be used to align the optical fiber or fibers 44 to the corresponding optoelectronic device or devices 6. Various suitable methods and materials may be used to secure optical transmission device 40 to the base substrate 16, electrical substrate 10, device die 4 arrangement. Optical transmission medium 40 is retained within optical connector 50 which may represent a connectorized or pigtailed connection.

According to another exemplary embodiment of the invention, a two-step alignment process may be used to position the optical ferrule and optical fiber after the encapsulant has been formed with precision and accuracy. Mechanical guides 18 may be used to generally guide optical connector 50 into global position over device die 4. According to this exemplary embodiment, mechanical guides 18 do not fit tightly within corresponding cavities 26; rather, some movement of mechanical guides 18 is allowed within corresponding cavities 26. The optical fibers are subsequently actively aligned to the optoelectronic devices to achieve fine alignment. After fine alignment is achieved, the components are permanently coupled using suitable methods and materials. These are exemplary methods only and various other suitable alignment, butt-coupling and other coupling methods may be used alternatively.

It should again be emphasized that the labels "front view" and "side view" used in conjunction with the figures and throughout the detailed description are included to designate the relative orientation of the figures to each other and were established in relation to the arbitrary "front view" designation assigned to the perspective view of the arrangement shown in FIG. 1. These designations are therefore intended to be illustrative and not restrictive of the invention.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A method for encapsulating an optoelectronic device, comprising the steps of:

providing a device die on a substrate, said device die including an optoelectronic device thereon;

forming a volume of fluid encapsulant material over said optoelectronic device;

shaping said volume of fluid encapsulant material into a shaped encapsulant covering said optoelectronic device by referencing a molding tool to at least one of said device die and said optoelectronic device;

curing said shaped encapsulant thereby forming a cured encapsulant; and removing said molding tool from the cured encapsulant.

2. The method as in claim 1, further comprising the step of positioning an end face of an optical transmission medium in confronting relation with said cured encapsulant, thereby butt-coupling said optoelectronic device to said optical transmission medium.

3. The method as in claim 1, in which said step of shaping includes shaping said volume of fluid encapsulant material into a substantially solid encapsulant and said step of curing comprises hardening said substantially solid encapsulant.

4. The method as in claim 1, in which said step of curing includes solidifying said shaped encapsulant.

5. The method as in claim 1, in which said step of providing includes said substrate having mechanical guides extending therefrom, and said step of shaping includes guiding a molding tool along said mechanical guides to an alignment position, said molding tool configured to shape said volume of fluid encapsulant material into said shaped encapsulant when in said alignment position.

6. The method as in claim 5, in which said step of shaping includes providing said molding tool including cavities therein, said cavities capable of receiving said mechanical guides therein, and said step of guiding includes sliding said molding tool such that said mechanical guides are received within said cavities.

7. The method as in claim 5, in which said step of shaping includes guiding said molding tool along said mechanical guides until a relief feature of said molding tool contacts said device die.

8. The method as in claim 2, in which said step of providing includes said substrate having mechanical guides extending therefrom, and said optical transmission medium is retained within a ferrule connector, said ferrule connector including cavities therein capable of receiving said mechanical guides, and said step of positioning includes translating said ferrule connector with respect to said optoelectronic device such that said mechanical guides are received within said cavities, and ceasing said translation when said ferrule connector contacts said cured encapsulant, said cured encapsulant acting as a mechanical stop.

9. The method as in claim 1, in which said step of shaping includes said shaped encapsulant encasing said optoelectronic device.

10. The method as in claim 1, in which said step of shaping includes said shaped encapsulant being an angled wedge having an upper surface being oblique to a substrate surface of said substrate.

11. The method as in claim 10, wherein said optoelectronic device emits light substantially normal to said substrate surface, and further comprising the steps of:

providing an optical transmission medium secured within a ferrule connector and including an end face angled obliquely with respect to an axis of said optical transmission medium; and positioning said obliquely angled end face parallel to said upper surface of said angled wedge such that an axis of said optical transmission medium is positioned substantially normal to said substrate surface and said end face is in confronting relation with said upper surface.

12. The method as in claim 10, in which said step of shaping includes said upper surface having a recessed portion therein and a peripheral portion, and further comprising the steps of providing an optical transmission medium retained within a ferrule, and positioning an end surface of said ferrule in contact with said peripheral portion.

13. The method as in claim 2, in which said step of positioning includes positioning said optical transmission medium to form a conterminous interface with said cured encapsulant.

14. The method as in claim 1, in which said substrate includes mechanical guides extending therefrom and said step of providing includes positioning said optoelectronic device on said substrate using a placement tool, said placement tool being guided into position using said mechanical guides, thereby aligning said optoelectronic device with respect to said substrate and said mechanical guides.

15. The method as in claim 2, in which said step of providing includes said substrate having mechanical guides extending therefrom and said step of shaping includes aligning a molding tool with respect to said optoelectronic device using said mechanical guides and said step of positioning includes positioning said optical transmission medium with respect to said optoelectronic device using said mechanical guides.

16. The method as in claim 1, wherein said step of forming comprises forming one of an epoxy, a curing gel and a transparent polymer over said optoelectronic device.

17. A method for coupling an optical transmission medium to an optoelectronic device, comprising the steps of:

providing an optoelectronic device on a device die on a substrate;

forming a volume of fluid encapsulant material over said optoelectronic device;

shaping said volume of fluid encapsulant material into a shaped encapsulant encasing said optoelectronic device by positioning a molding tool in an alignment position with respect to said device die using vision-based alignment techniques;

curing said shaped encapsulant, thereby hardening said shaped encapsulant; and positioning an end face of an optical transmission medium in confronting relation with said hardened encapsulant, thereby butt-coupling said optoelectronic device to said optical transmission medium.

18. An optical subassembly comprising:

an optoelectronic device formed on an upper planar surface of a device substrate, said device substrate mounted on a mounting substrate, an encapsulant formed over said optoelectronic device and having a top surface, and an optical transmission medium secured within an optical ferrule having an end surface in confronting relation with said top surface and configured generally perpendicular to said upper planar surface, said top surface of said encapsulant being oblique with respect to said upper planar surface and said end surface being oblique to an axis of said optical transmission medium, said top surface and said end surface forming a substantially conterminous interface.

19. The optical subassembly as in claim 18, in which said encapsulant encases said optoelectronic device and further including a wire bond formed on said upper planar surface and coupling said optoelectronic device to a further component, said encapsulant further encasing said wire bond, and said encapsulant having a first thickness over said optoelectronic device and a second thickness being greater than said first thickness in a region proximate to said wire bond.

20. The optical subassembly as in claim 18, wherein said optoelectronic device comprises a VCSEL (vertical cavity surface emitting laser).

21. An optical subassembly comprising:
    an optoelectronic device formed on an upper planar surface of a device substrate, said device substrate mounted on a mounting substrate,
    an encapsulant formed over said optoelectronic device and having a top surface, and
    an optical transmission medium secured within an optical ferrule having an end surface in confronting relation with said top surface and configured generally perpendicular to said upper planar surface.
    said encapsulant comprising an angled wedge and said optical transmission medium includes an end face being substantially parallel to said top surface.

22. The optical subassembly as in claim 18, wherein said encapsulant includes a recessed portion over said optoelectronic device and a peripheral portion, said end surface and said peripheral portion fanning a substantially conterminous interface.

23. The optical subassembly as in claim 22, in which said recessed portion is essentially parallel to said top surface.

24. The optical subassembly as in claim 18, wherein said encapsulant comprises one of a plastic, an epoxy, a curing gel, and a transparent polymer.

25. The optical subassembly as in claim 18, in which said encapsulant includes a thickness over said optoelectronic device being no greater than 35 micrometers.

26. The optical subassembly as in claim 18, wherein said optoelectronic device comprises a monitor photodiode.

27. An optical subassembly comprising:
    a device die including an array of optoelectronic devices thereon, said device die mounted on a mounting substrate and including an upper planar surface, and an encapsulant encasing said device die and having a top surface which is obliquely angled with respect to said upper planar surface, and
    a corresponding array of optical fibers secured within an optical ferrule having an end face in confronting relation with said top surface and obliquely angled with respect to axes of said optical fibers, each of said optical fibers configured generally perpendicular to said upper planar surface.

28. The optical subassembly as in claim 27, in which each of said optoelectronic devices comprises a single mode VCSEL (vertical cavity surface emitting lasers) that emits light having a wavelength of about 1310 nm, said optical fibers each comprise a single mode fiber, and said encapsulant includes a thickness over said optoelectronic devices being no greater than about 35 micrometers.

29. A method for encapsulating an optoelectronic device, comprising the steps of:
    providing a substrate having fixed mechanical guides;
    providing a device die including an optoelectronic device thereon;
    positioning said device die on said substrate using a placement tool, said placement tool being guided into position using said mechanical guides thereby aligning said optoelectronic device with respect to said substrate and said mechanical guides;
    dispensing a volume of fluid encapsulant material over said optoelectronic device;
    shaping said volume of fluid encapsulant material into a shaped encapsulant covering said optoelectronic device wherein said step of shaping include, guiding a molding tool along said mechanical guides to an alignment position, said molding tool configured to shape said volume of fluid encapsulant material into said shaped encapsulant when in said alignment position; and
    curing said shaped encapsulant with said molding tool in place to thereby form a cured encapsulant.

30. The method of claim 29, further comprising the steps of:
    removing the molding tool;
    positioning an end face of an optical transmission medium in confronting relation with said cured encapsulant, thereby removably butt-coupling said optoelectronic device to said optical transmission medium.

31. The method of claim 30, wherein said optical transmission medium is retained within a ferrule connector, said ferrule connector including cavities therein capable of receiving said mechanical guides, and said step of positioning includes translating said ferrule connector with respect to said optoelectronic device such that said mechanical guides are received within said cavities, and ceasing said translation when said ferrule connector contacts said cured encapsulant, said cured encapsulant acting as a mechanical stop.

* * * * *